US008549371B1

United States Patent
Lee

(10) Patent No.: US 8,549,371 B1
(45) Date of Patent: Oct. 1, 2013

(54) SEMICONDUCTOR MEMORY DEVICE

(75) Inventor: Eun Ryeong Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/613,652

(22) Filed: Sep. 13, 2012

(51) Int. Cl.
  *G01R 31/28* (2006.01)
(52) U.S. Cl.
  USPC .......................................... 714/733; 714/718
(58) Field of Classification Search
  USPC ................. 365/194; 323/314; 714/724, 763, 714/30, 718, 733
  See application file for complete search history.

(56) References Cited

U.S. PATENT DOCUMENTS

| 6,782,498 | B2 * | 8/2004 | Tanizaki et al. ............... 714/733 |
| 7,480,841 | B2 * | 1/2009 | Kai et al. ....................... 714/724 |
| 7,793,174 | B2 * | 9/2010 | Hattori et al. ................. 714/718 |
| 8,151,149 | B2 * | 4/2012 | Lee et al. ....................... 714/718 |
| 2003/0102885 | A1 | 6/2003 | Tsuboi et al. |
| 2008/0126911 | A1 * | 5/2008 | Brittain et al. ................ 714/763 |
| 2012/0081100 | A1 * | 4/2012 | Lee et al. ....................... 323/314 |
| 2012/0250435 | A1 * | 10/2012 | Matsunaga et al. ........... 365/194 |

FOREIGN PATENT DOCUMENTS

KR   1020080100100 A   11/2008

* cited by examiner

*Primary Examiner* — David Ton
(74) *Attorney, Agent, or Firm* — William Park & Associates Patent Ltd.

(57) ABSTRACT

A semiconductor memory device includes a test mode signal generation circuit configured to generate test mode signals which are selectively enabled, in response to a test enable signal which is enabled upon entry into a test mode; and a test mode signal output circuit configured to store the test mode signals in response to an input control signal and output the test mode signals in response to an output control signal, wherein the input control signal is enabled when a test write signal is generated according to a combination of commands, and the output control signal is a signal which is generated by delaying a test read signal a preset amount of time, where the test read signal is generated according to a combination of the commands.

19 Claims, 6 Drawing Sheets

SEMICONDUCTOR MEMORY DEVICE

CROSS-REFERENCE TO RELATED APPLICATION

The present application claims priority under 35 U.S.C. 119(a) to Korean Patent Application No. 10-2012-0053904 filed on May 21, 2012 in the Korean Intellectual Property Office, which is incorporated herein by reference in its entirety as set forth in full.

BACKGROUND

A semiconductor memory device has a test mode for testing a normal operation before an end product is placed on the market. The testing is typically performed to determine whether there is a problem in an operation of a semiconductor memory device so that semiconductor memory devices capable of normal operation can be sorted as a good product. Such a test is performed as a semiconductor memory device enters a test mode, and a test result is monitored to determine whether the semiconductor memory device is operating normally.

FIG. 1 is a block diagram showing the configuration of a conventional semiconductor memory device.

Referring to FIG. 1, a semiconductor memory device includes a test circuit 1 configured to receive a test enable signal TMEN which is enabled upon entry into a test mode and generate test mode signals TM<1:2> which are selectively enabled according to the test mode. The semiconductor memory device may also include an internal circuit 2 configured to perform a test according to a combination of the test mode signals TM<1:2>.

In such a semiconductor memory device, an operation error of the internal circuit 2 can be checked through a test result after performing the test. Cases where the operation error of the internal circuit 2 is checked include a case where a failure occurs during the test of the internal circuit 2 after entry into the test mode, and a case where a failures occurs because the levels of the test mode signals are not properly generated and thus it is impossible to enter the test mode. In this regard, there is no way to distinguish these two cases from each other by checking only the operation error of the internal circuit 2.

SUMMARY

An embodiment of the present invention relates to a semiconductor memory device in which test mode signals are stored in a register unit upon entry into a test verification mode and the stored test mode signals are outputted to an outside through a DQ pad so that a generation error of the test mode signals may be detected, whereby it is possible to determine whether or not a test mode has been entered.

In one embodiment, a semiconductor memory device includes: a test mode signal generation circuit configured to generate test mode signals which are selectively enabled, in response to a test enable signal which is enabled upon entry into a test mode; and a test mode signal output circuit configured to store the test mode signals in response to an input control signal and output the test mode signals in response to an output control signal, wherein the input control signal is enabled when a test write signal is generated according to a combination of commands, and the output control signal is a signal which is generated by delaying a test read signal a preset amount of time, where the test read signal is generated according to a combination of the commands.

In another embodiment, a semiconductor memory device includes: an input/output control signal generation block configured to generate an input control signal which is enabled when a test write signal is generated according to a combination of inputted commands, and delay a test read signal which is generated according to a combination of the commands, a preset amount of time, and generate an output control signal; and a register unit configured to store test mode signals in response to the input control signal, and buffer the test mode signals in response to the output control signal and generate delayed test mode signals.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
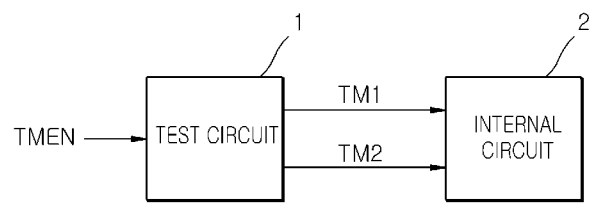
FIG. 1 is a block diagram showing a configuration of a conventional semiconductor memory device.
Figure 2:
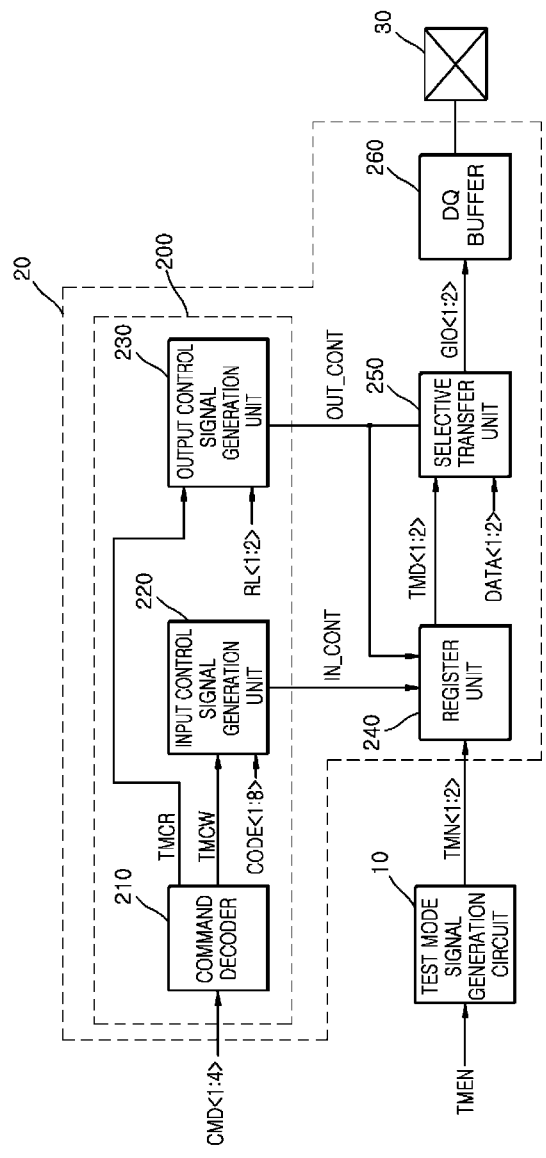
FIG. 2 is a block diagram showing a configuration of a semiconductor memory device in accordance with an embodiment of the present invention.

FIG. 2 is a block diagram showing a configuration of a semiconductor memory device in accordance with an embodiment of the present invention.

Referring to FIG. 2, a semiconductor memory device includes a test mode signal generation circuit 10 configured to receive a test enable signal TMEN which is enabled when the semiconductor memory device enters a test mode and generate first and second test mode signals TMN<1:2> which are selectively enabled. The semiconductor memory device may also include a test mode signal output circuit 20 configured to decode commands CMD<1:4> inputted from outside the semiconductor memory device. The test mode signal output circuit 20 may also be configured to generate a test write signal TMCW and a test read signal TMCR. The test mode signal output circuit 20 may be configured to store the first and second test mode signals TMN<1:2> according to an input control signal IN_CONT. The input control signal IN_CONT may be enabled when the test write signal TMCW is generated. Further, the test mode signal output circuit 20 may be configured to output the first and second test mode signals TMN<1:2> according to an output control signal OUT_CONT which is generated by delaying the test read signal TMCR a preset amount of time. The test write signal TMCW and the test read signal TMCR are signals which are generated to enter a test verification mode.

The test mode signal output circuit 20 includes an input/output control signal generation block 200, a register unit 240, a selective transfer unit 250, and a DQ buffer 260.

The input/output control signal generation block 200 includes a command decoder 210, an input control signal generation unit 220, and an output control signal generation unit 230. The command decoder 210 may be configured to decode the first to fourth commands CMD<1:4>, and the command decoder 210 may be configured to generate the test write signal TMCW when the combination of the first to fourth commands CMD<1:4> is a first combination and generate the test read signal TMCR when the combination of the first to fourth commands CMD<1:4> is a second combination. The input control signal generation unit 220 may be configured to generate the input control signal IN_CONT according to a combination of inputted first to eighth code signals CODE<1:8>. The output control signal generation unit 230 may be configured to generate the output control signal OUT_CONT by delaying the test read signal TMCR by a preset delay amount according to first and second read latency signals RL<1:2>, where the test read signal TMCR may be delayed from a time when the test verification mode is entered. The first and second read latency signals RL<1:2> may be selectively enabled to set an output period of a signal to be outputted through a DQ pad 30. The first to fourth commands CMD<1:4> may be set in a variety of ways according to embodiments so as to generate the test write signal TMCW and the test read signal TMCR. Further, the combination of the first to eighth code signals CODE<1:8>, inputted to enter the test verification mode, may be preset in a variety of ways according to embodiments.

The configuration of the output control signal generation unit 230 will be described in detail with reference to FIG. 3.

Figure 3:
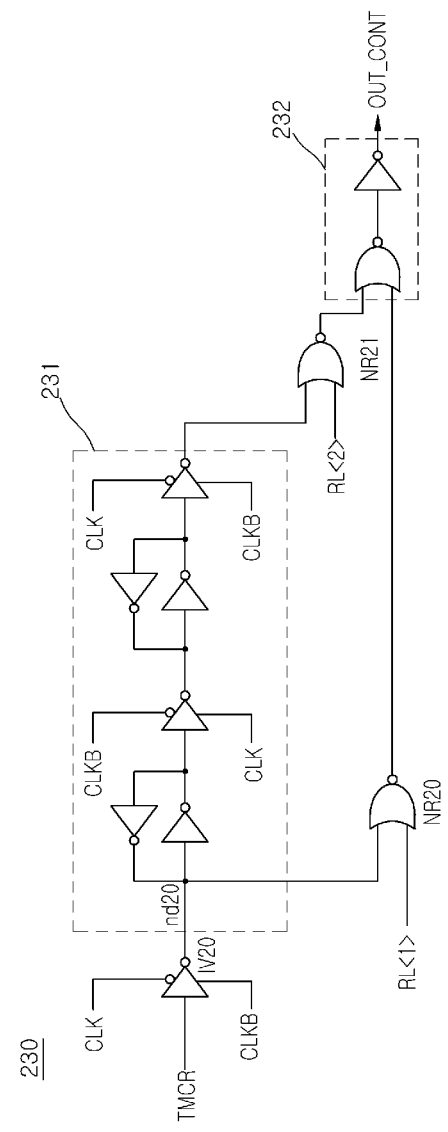
FIG. 3 is a circuit diagram of an output control signal generation unit included in the semiconductor memory device shown in FIG. 2.

Referring to FIG. 3, the output control signal generation unit 230 includes an inverter IV20, a NOR gate NR20, a delay section 231, a NOR gate NR21, and a logic section 232. The inverter IV20 may be configured to receive an external clock CLK, delay the test read signal TMCR by a first delay amount and output a resultant signal to a node nd20. The NOR gate NR20 may be configured to buffer the signal of the node nd20 when the first read latency signal RL<1> is enabled to a logic low level and output a resultant signal. The delay section 231 may be configured to delay the signal of the node nd20 by a second delay amount and output a resultant signal. The NOR gate NR21 may be configured to buffer the output signal of the delay section 231 when the second read latency signal RL<2> is enabled to a logic low level and output a resultant signal. The logic section 232 may be configured to AND the output signal of the NOR gate NR20 and the output signal of the NOR gate NR21 and generate the output control signal OUT_CONT. That is to say, the output control signal generation unit 230 generates the output control signal OUT_CONT by delaying the test read signal TMCR by the first delay amount when the first read latency signal RL<1> is enabled upon entry into the test verification mode, and generates the output control signal OUT_CONT by delaying the test read signal TMCR by the second delay amount when the second read latency signal RL<2> is enabled. The first delay amount may be shorter than the second delay amount. An inverted external clock CLKB is the inverted signal of the external clock CLK. Also, the first and second read latency signals RL<1:2> are signals which are selectively enabled to set the output period of the signal to be outputted through the DQ pad, measured from the time when the test verification mode is entered.

The register unit 240 includes a first register section 241 and a second register section 242. The first register section 241 may be configured to store the first test mode signal TMN<1> when the input control signal IN_CONT is inputted, and buffer the first test mode signal TMN<1> when the output control signal OUT_CONT is inputted and generate a first delayed test mode signal TMD<1>. The second register section 242 may be configured to store the second test mode signal TMN<2> when the input control signal IN_CONT is inputted, and buffer the second test mode signal TMN<2> when the output control signal OUT_CONT is inputted and generate a second delayed test mode signal TMD<2>.

The configuration of the register unit 240 will be described in detail with reference to FIG. 4.

Figure 4:
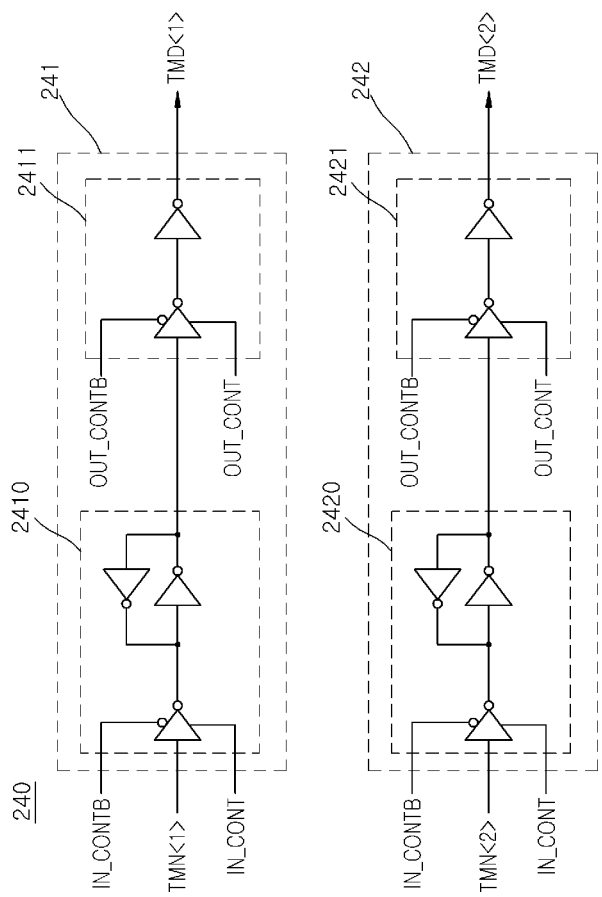
FIG. 4 is a circuit diagram of a register unit included in the semiconductor memory device shown in FIG. 2.

Referring to FIG. 4, the first register section 241 of the register unit 240 includes a first latch part 2410 and a first buffer part 2411. The first latch part 2410 may be configured to store the first test mode signal TMN<1> when the input control signal IN_CONT is inputted at a logic high level. The first buffer part 2411 may be configured to buffer the first test mode signal TMN<1>, stored in the first latch part 2410, when the output control signal OUT_CONT is inputted at a logic high level and generate the first delayed test mode signal TMD<1>. The second register section 242 of the register unit 240 includes a second latch part 2420 and a second buffer part 2421. The second latch part 2420 may be configured to store the second test mode signal TMN<2> when the input control signal IN_CONT is inputted at the logic high level. The second buffer part 2421 may be configured to buffer the second test mode signal TMN<2>, stored in the second latch part 2420, at the time when the output control signal OUT_CONT is inputted at the logic high level and generate the second delayed test mode signal TMD<2>. In other words, the register unit 240 stores the first and second test mode signals TMN<1:2> in response to the input control signal IN_CONT, and buffers the first and second test mode signals TMN<1:2> in response to the output control signal OUT_CONT and generates the first and second delayed test mode signals TMD<1:2>. An inverted input control signal IN_CONTB is the inverted signal of the input control signal IN_CONT, and an inverted output control signal OUT_CONT is the inverted signal of the output control signal OUT_CONT.

The selective transfer unit 250 includes a first selective transfer section 251 and a second selective transfer section 252. The selective transfer unit 250 may be configured to transfer at least one of the delayed test mode signals TMD<1:2> and data of a memory cell to global lines GIO<1:2> in response to the output control signal OUT_CONT. For example, the first selective transfer section 251 may be configured to transfer the first delayed test mode signal TMD<1> to a first global line GIO<1> when the output control signal OUT_CONT is enabled and transfer first data DATA<1> of a memory cell to the first global line GIO<1> when the output control signal OUT_CONT is disabled. The second selective transfer section 252 may be configured to transfer the second delayed test mode signal TMD<2> to a second global line GIO<2> when the output control signal OUT_CONT is enabled and transfer second data DATA<1> of the memory cell to the second global line GIO<2> when the output control signal OUT_CONT is disabled.

A configuration of the selective transfer unit 250 will be described in detail with reference to FIG. 5.

Figure 5:
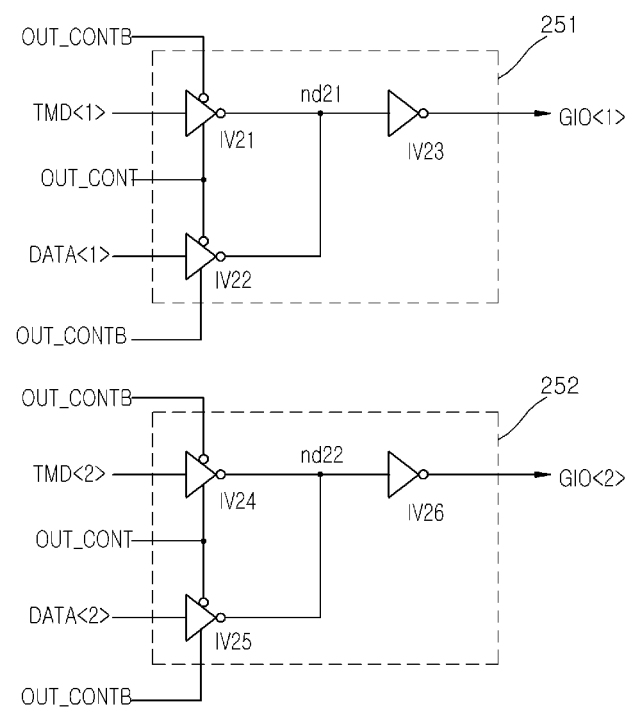
FIG. 5 is a circuit diagram of a selective transfer unit included in the semiconductor memory device shown in FIG. 2.

Referring to FIG. 5, the first selective transfer section 251 of the selective transfer unit 250 includes an inverter IV21, an inverter IV22 and an inverter IV23. The inverter IV21 may be configured to transfer the first delayed test mode signal TMD<1> to a node nd21 when the output control signal OUT_CONT is enabled to the logic high level. The inverter IV22 may be configured to transfer the first data DATA<1> of the memory cell to the node nd21 when the output control signal OUT_CONT is disabled to a logic low level. The inverter IV23 may be configured to buffer the signal of the node nd21 and transfer a resultant signal to the first global line GIO<1>. The second selective transfer section 252 of the selective transfer unit 250 includes an inverter IV24, and inverter IV25 and an inverter IV26. The inverter IV24 may be configured to transfer the second delayed test mode signal TMD<2> to a node nd22 when the output control signal OUT_CONT is enabled to the logic high level. The inverter IV25 may be configured to transfer the second data DATA<2> of the memory cell to the node nd22 when the output control signal OUT_CONT is disabled to the logic low level. The inverter IV26 may be configured to buffer the signal of the node nd22 and transfer a resultant signal to the second global line GIO<2>.

The DQ buffer 260 (See FIG. 2) may be configured to buffer the signals of the first and second global lines GIO<1:2> and output resultant signals outside the semiconductor memory device through the DQ pad 30.

Operations of the semiconductor memory device configured as mentioned above, for storing the test mode signals in the register unit upon entering the test verification mode and outputting the test mode signals stored in the register unit to the outside through the DQ pad, will be described with reference to FIGS. 2 to 5, exemplifying that the output period of the signal to be outputted through the DQ pad, measured from the time when the test verification mode is entered, is set as the second delay amount and thus the second read latency signal is enabled.

The test mode signal generation circuit 10 receives the test enable signal TMEN which is enabled upon entry to the test mode, and generates the first and second test mode signals TMN<1:2> which are selectively enabled.

The command decoder 210 generates the test write signal TMCW when the combination of the first to fourth commands CMD<1:4> is the first combination upon entry into the test verification mode, and generates the test read signal TMCR when the combination of the first to fourth commands CMD<1:4> is the second combination.

The input control signal generation unit 220 receives the first to eighth code signals CODE<1:8> which are inputted from the outside to enter the test verification mode, and generates the input control signal IN_CONT which is enabled to the logic high level when the test read signal TMCR is inputted.

The output control signal generation unit 230 receives the second read latency signal RL<2> which is enabled to the logic low level upon entry into the test verification mode, delays the test read signal TMCR by the second delay amount, and generates the output control signal OUT_CONT.

The register unit 240 stores the first and second test mode signals TMN<1:2> when the input control signal IN_CONT is enabled to the logic high level. Further, the register unit 240 buffers the first and second test mode signals TMN<1:2> when the output control signal OUT_CONT is enabled to the logic high level and generates the first and second delayed test mode signals TMD<1:2>.

The selective transfer unit 250 transfers the first and second delayed test mode signals TMD<1:2> to the first and second global lines GIO<1:2> when the output control signal OUT_CONT is enabled to the logic high level. Since the output control signal OUT_CONT is enabled to the logic high level, the selective transfer unit 250 does not transfer the first and second data DATA<1:2> to the first and second global lines GIO<1:2>.

The DQ buffer 260 buffers the signals of the first and second global lines GIO<1:2> and outputs the resultant signals to the outside through the DQ pad 30.

In the semiconductor memory device in accordance with an embodiment of the present invention, test mode signals are stored in a register unit upon entry into a test verification mode, and the stored test mode signals are outputted outside the semiconductor memory device through a DQ pad. As a consequence, since a generation error of the test mode signals may be detected, it is possible to check whether or not a test mode is entered.

Figure 6:
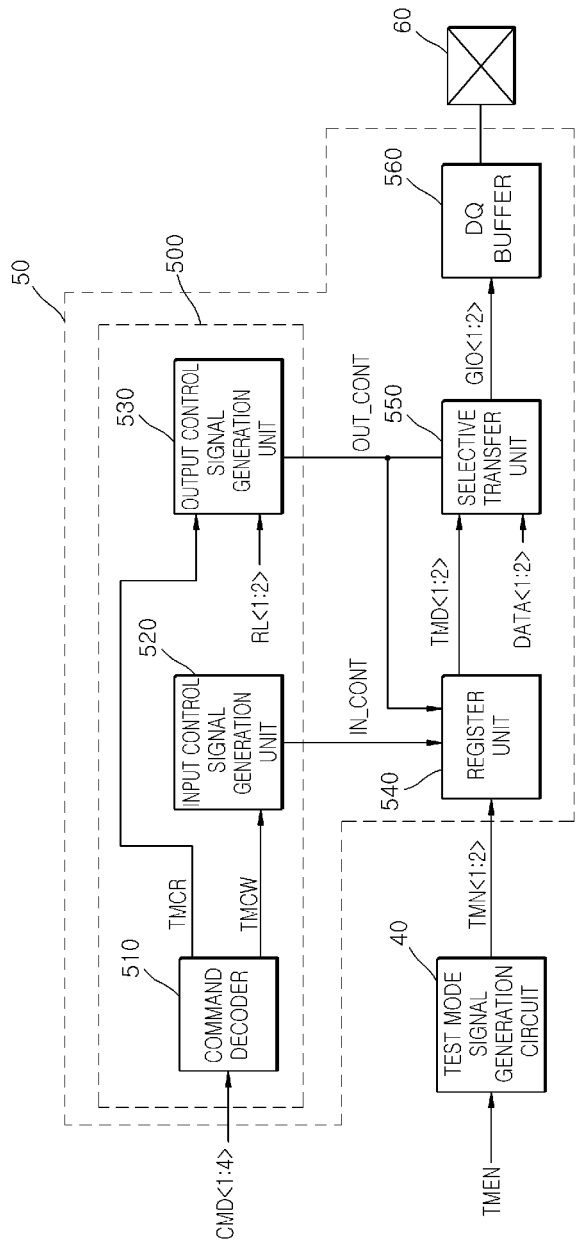
FIG. 6 is a block diagram showing a configuration of a semiconductor memory device in accordance with another embodiment of the present invention.

FIG. 6 is a block diagram showing the configuration of a semiconductor memory device in accordance with another embodiment of the present invention.

Referring to FIG. 6, a semiconductor memory device includes a test mode signal generation circuit 40 and a test mode signal output circuit 50. The test mode signal generation circuit 40 may be configured to receive a test enable signal TMEN which is enabled upon entry into a test mode and generate first and second test mode signals TMN<1:2> which are selectively enabled. The test mode signal output circuit 50 may be configured to decode commands CMD<1:4> inputted from an outside, generate a test write signal TMCW and a test read signal TMCR, store the first and second test mode signals TMN<1:2> according to an input control signal IN_CONT which is enabled when the test write signal TMCW is generated, and output the first and second test mode signals TMN<1:2> according to an output control signal OUT_CONT which is generated by delaying the test read signal TMCR a preset amount of time. The test write signal TMCW and the test read signal TMCR are signals which are generated to enter a test verification mode.

The test mode signal output circuit 50 includes an input/output control signal generation block 500, a register unit 540, a selective transfer unit 550, and a DQ buffer 560.

The input/output control signal generation block 500 includes a command decoder 510, an input control signal generation unit 520 and an output control signal generation unit 530. The command decoder 510 may be configured to generate the test write signal TMCW when the combination of the first to fourth commands CMD<1:4> inputted from the outside is a first combination and generate the test read signal TMCR when the combination of the first to fourth commands CMD<1:4> is a second combination. The input control signal generation unit 520 may be configured to generate the input control signal IN_CONT which is enabled at the time when the test write signal TMCW is generated. The output control signal generation unit 530 may be configured to generate the output control signal OUT_CONT by delaying the test read signal TMCR by a preset delay amount according to first and second read latency signals RL<1:2> which are selectively enabled to set the output period of a signal to be outputted through a DQ pad, where the delay of the test read signal TMCR is measured from a time when the test verification mode is entered. Since the output control signal generation unit 530 is configured using a substantially similar circuit as the output control signal generation unit 230 shown in FIG. 3 and performs substantially similar operations, detailed descriptions thereof will be omitted herein.

The register unit 540 is configured to store the first and second test mode signals TMN<1:2> when the input control signal IN_CONT is inputted, and buffer the first and second test mode signals TMN<1:2> when the output control signal OUT_CONT is inputted. The register unit 540 may generate first and second delayed test mode signals TMD<1:2>. Since the register unit 540 is configured using a substantially similar circuit as the register unit 240 shown in FIG. 4 and performs substantially similar operations, detailed descriptions thereof will be omitted herein.

The selective transfer unit 550 is configured to transfer the first and second delayed test mode signals TMD<1:2> to first and second global lines GIO<1:2> when the output control signal OUT_CONT is enabled. The selective transfer unit 550 may also transfer first and second data DATA<1:2> of a memory cell to the first and second global lines GIO<1:2> when the output control signal OUT_CONT is disabled. Since the selective transfer unit 550 is configured using a substantially similar circuit as the selective transfer unit 550 shown in FIG. 5 and performs the substantially same operations, detailed descriptions thereof will be omitted herein.

The DQ buffer 560 is configured to buffer the signals of the first and second global lines GIO<1:2> and output resultant signals outside the semiconductor memory device through a DQ pad 60.

In the semiconductor memory device in accordance with another embodiment of the present invention, test mode signals are stored in a register unit upon entry into a test verification mode, and the stored test mode signals are outputted through a DQ pad. As a consequence, since a generation error of the test mode signals may be detected, it is possible to check whether or not a test mode is entered.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   a test mode signal generation circuit configured to generate test mode signals which are selectively enabled, in response to a test enable signal which is enabled upon entry into a test mode; and
   a test mode signal output circuit configured to store the test mode signals in response to an input control signal and output the test mode signals in response to an output control signal,
   wherein the input control signal is enabled when a test write signal is generated according to a combination of commands, and the output control signal is a signal which is generated by delaying a test read signal a preset amount of time, where the test read signal is generated according to a combination of the commands.

2. The semiconductor memory device according to claim 1, wherein the test mode signal output circuit comprises:
   an input/output control signal generation block configured to generate the input control signal, and delay the test read signal by a preset delay amount according to read latency signals and generate the output control signal; and a register unit configured to store the test mode signals in response to the input control signal, and buffer the test mode signals in response to the output control signal and generate delayed test mode signals.

3. The semiconductor memory device according to claim 2, wherein the input/output control signal generation block comprises:
   a command decoder configured to decode the commands and generate the test write signal and the test read signal;
   an input control signal generation unit configured to generate the input control signal according to code signals inputted from outside the semiconductor memory device; and
   an output control signal generation unit configured to delay the test read signal by the preset delay amount according to first and second read latency signals which are selectively enabled to set an output period of a signal to be outputted through a DQ pad, measured from a time when a test verification mode is entered, and generate the output control signal.

4. The semiconductor memory device according to claim 3, wherein the output control signal is a signal which is generated by delaying the test read signal by a first delay amount when the first read latency signal is enabled.

5. The semiconductor memory device according to claim 4, wherein the output control signal is a signal which is generated by delaying the test read signal by a second delay amount when the second read latency signal is enabled.

6. The semiconductor memory device according to claim 5, wherein the first delay amount is shorter than the second delay amount.

7. The semiconductor memory device according to claim 2, wherein the register unit comprises:
   a first register section configured to store a first test mode signal in response to the input control signal, and buffer the first test mode signal in response to the output control signal and output a first delayed test mode signal; and
   a second register section configured to store a second test mode signal in response to the input control signal, and buffer the second test mode signal in response to the output control signal and output a second delayed test mode signal.

8. The semiconductor memory device according to claim 7, wherein the first register section comprises:
   a first latch part configured to store the first test mode signal in response to the input control signal; and
   a first buffer part configured to buffer the first test mode signal stored in the first latch part in response to the output control signal and output the first delayed test mode signal.

9. The semiconductor memory device according to claim 7, wherein the second register section comprises:
   a second latch part configured to store the second test mode signal in response to the input control signal; and
   a second buffer part configured to buffer the second test mode signal stored in the second latch part in response to the output control signal and output the second delayed test mode signal.

10. The semiconductor memory device according to claim 7, wherein the test mode signal output circuit further comprises:
    a selective transfer unit configured to transfer at least one of the delayed test mode signals and data of a memory cell to global lines in response to the output control signal; and
    a DQ buffer configured to output signals of the global lines to an outside through a DQ pad.

11. The semiconductor memory device according to claim 10, wherein the selective transfer unit comprises:
    a first selective transfer section configured to transfer the first delayed test mode signal to a first global line when the output control signal is enabled, and transfer first data of the memory cell to the first global line when the output control signal is disabled; and
    a second selective transfer section configured to transfer the second delayed test mode signal to a second global line when the output control signal is enabled, and transfer second data of the memory cell to the second global line when the output control signal is disabled.

12. A semiconductor memory device comprising:
- an input/output control signal generation block configured to generate an input control signal which is enabled when a test write signal is generated according to a combination of inputted commands, and delay a test read signal which is generated according to a combination of the commands, a preset amount of time, and generate an output control signal; and
- a register unit configured to store test mode signals in response to the input control signal, and buffer the test mode signals in response to the output control signal and generate delayed test mode signals.

13. The semiconductor memory device according to claim 12, wherein the input/output control signal generation block comprises:
- a command decoder configured to decode the commands and generate the test write signal and the test read signal;
- an input control signal generation unit configured to generate the input control signal which is enabled at the time when the test write signal is generated if a combination of code signals inputted from outside the semiconductor device is a preset combination; and
- an output control signal generation unit configured to delay the test read signal by the preset delay amount according to first and second read latency signals which are selectively enabled to set an output period of a signal to be outputted through a DQ pad, measured from a time when a test verification mode is entered, and generate the output control signal.

14. The semiconductor memory device according to claim 13, wherein the output control signal is a signal which is generated by delaying the test read signal by a first delay amount when the first read latency signal is enabled.

15. The semiconductor memory device according to claim 14, wherein the output control signal is a signal which is generated by delaying the test read signal by a second delay amount when the second read latency signal is enabled.

16. The semiconductor memory device according to claim 15, wherein the first delay amount is shorter than the second delay amount.

17. The semiconductor memory device according to claim 12, wherein the register unit comprises:
- a first register section configured to store a first test mode signal which is enabled upon entry into a test mode, in response to the input control signal, and buffer the first test mode signal in response to the output control signal and generate a first delayed test mode signal; and
- a second register section configured to store a second test mode signal which is enabled upon entry to the test mode, in response to the input control signal, and buffer the second test mode signal in response to the output control signal and generate a second delayed test mode signal.

18. The semiconductor memory device according to claim 17, further comprising a test mode signal output circuit which comprises:
- a selective transfer unit configured to transfer at least one of the delayed test mode signals and data of a memory cell to a global lines in response to the output control signal; and
- a DQ buffer configured to output signals of the global lines to an outside through a DQ pad.

19. The semiconductor memory device according to claim 18, wherein the selective transfer unit comprises:
- a first selective transfer section configured to transfer the first delayed test mode signal to a first global line when the output control signal is enabled, and transfer first data of the memory cell to the first global line when the output control signal is disabled; and
- a second selective transfer section configured to transfer the second delayed test mode signal to a second global line when the output control signal is enabled, and transfer second data of the memory cell to the second global line when the output control signal is disabled.

* * * * *